United States Patent
Cohen

(10) Patent No.: US 6,560,749 B1
(45) Date of Patent: May 6, 2003

(54) APPARATUS AND METHOD FOR IMPLEMENTING A DECODER FOR CONVOLUTIONALLY ENCODED SYMBOLS

(75) Inventor: Paul E. Cohen, San Jose, CA (US)

(73) Assignee: NEC Electronics, Inc., Santa Clara, CA (US)

( * ) Notice: Subject to any disclaimer, the term of this patent is extended or adjusted under 35 U.S.C. 154(b) by 0 days.

(21) Appl. No.: 09/493,764

(22) Filed: Jan. 28, 2000

(51) Int. Cl.$^7$ ............................................. H03M 13/03
(52) U.S. Cl. ...................................................... 714/792
(58) Field of Search ........................... 714/792; 375/262

(56) References Cited

U.S. PATENT DOCUMENTS

| | | | | |
|---|---|---|---|---|
| 4,462,101 A | * | 7/1984 | Yasuda et al. ............... | 714/794 |
| 5,220,570 A | * | 6/1993 | Lou et al. .................... | 714/791 |
| 5,303,263 A | * | 4/1994 | Shoji et al. ................... | 375/229 |
| 5,408,502 A | * | 4/1995 | How ........................... | 375/340 |
| 5,432,803 A | * | 7/1995 | Liu et al. ..................... | 714/794 |
| 5,479,419 A | * | 12/1995 | Naoi et al. ................... | 714/794 |
| 5,600,677 A | * | 2/1997 | Citta et al. ................... | 375/296 |
| 5,907,586 A | * | 5/1999 | Katsuragawa et al. ....... | 375/341 |
| 5,974,091 A | * | 10/1999 | Huff ........................... | 375/265 |
| 6,016,568 A | * | 1/2000 | Wolf et al. ................... | 714/792 |
| 6,034,997 A | * | 3/2000 | Mackenthun ................ | 375/265 |
| 6,035,428 A | * | 3/2000 | Jekal ........................... | 714/702 |
| 6,205,187 B1 | * | 3/2001 | Westfall ...................... | 375/341 |
| 6,259,749 B1 | * | 7/2001 | Andoh ......................... | 375/341 |
| 6,374,387 B1 | * | 4/2002 | van den Berghe .......... | 714/790 |

OTHER PUBLICATIONS

"A Multistate Search Of Algebraic Celp Codebooks," Miguel Arjona Ramirez and Max Gerken, Electronics Eng. Dept., University of Sao Paulo.

"A Fast Search Method Of Algebraic Codebook By Reordering Search Sequence," Nam Kyu Ha, Samsung Advanced Institute of Technology.

"Generalized Trace–Back Techniques for Survisor Memory Management in the Viterbi Algorithm," Robert Cypher and C. Bernard Shung, Journal of VLSI Signal Processing, 5, 85–94, 1993.

"Convolutional Encoding And Viterbi Decoding" Dion Messer Funderburk, Apr.

"A Fast Search Method Of Algebraic Codebook By Reordering Search Sequence," Nam Kyu Ha, Samsung Advanced Institute of Technology.

"Memory Management In A Viterbi Decoder," Charles M. Rader, Transactions On Communications, vol. Com–29, No. 9, Sep., 1981.

"Viterbi Decoder Designs Using IP Soft Cores," Scott R. Powell, Wayne L. Marking, and Thomas M. Cesear, Inventra™Parameterized Soft Cores Business Unit, Mentor Graphics Corp.

"Digital Signal Processor," NEC, Sep., 1998.

* cited by examiner

*Primary Examiner*—Albert Decady
*Assistant Examiner*—Joseph D. Torres
(74) *Attorney, Agent, or Firm*—Skjerven Morrill LLP

(57) ABSTRACT

An apparatus and method for implementing a decoder for convolutionally encoded symbols (e.g., a viterbi decoder) is described. In one embodiment, a file of all the initial states (or their equivalents) and the nth surviving states associated with the initial states is stored along with the path metric. The initial states (or their equivalents) are an index to a previous file. A new file or files are then generated. An appropriate criterion is utilized to select a final surviving state. The path can be traced back through a plurality of files and the "most likely" path determined. The identifying binary numbers of the final states of each file and the binary numbers of an original initial state determine the "most likely" sequence of convolutionally-encoded symbols received by the decoder.

9 Claims, 10 Drawing Sheets

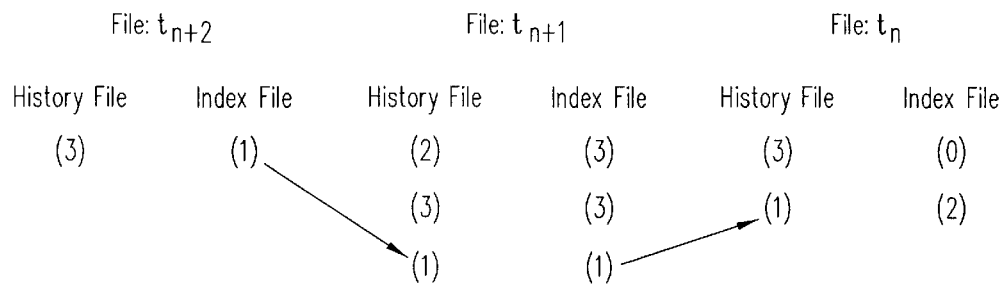
FIG. 9A
(2) ⟶ (1) ⟶ (1) ⟶ (3) => 10010111
FIG. 9B
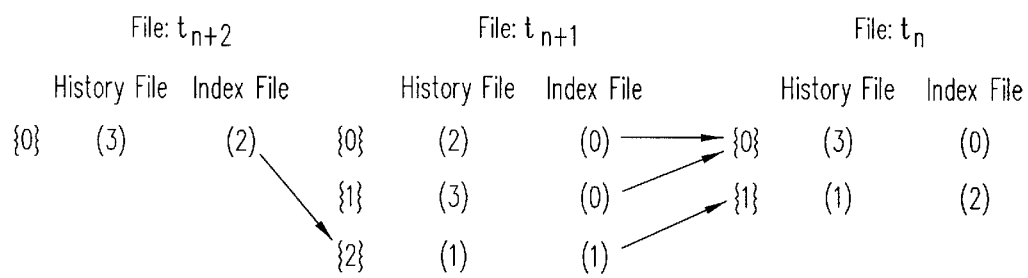
FIG. 10A
(2) ⟶ (1) ⟶ (1) ⟶ (3) => 10010111
FIG. 10B

APPARATUS AND METHOD FOR IMPLEMENTING A DECODER FOR CONVOLUTIONALLY ENCODED SYMBOLS

CROSS-REFERENCE TO RELATED APPLICATIONS

U.S. application Ser. No. 09/493,767 filed on Jan. 28, 2000, and entitled "Digital Signal Processor Implementation of a Decoder for Convolutionally Encoded Symbols" is a related U.S. Application is incorporated by reference herewith.

BACKGROUND OF THE INVENTION

1. Field of the Invention

This invention relates generally to communication techniques and, more particularly, to the decoding of digital signals in a communication system. In the communication system envisioned by the present invention, each bit of information has been encoded in a multiplicity of transmitted signals. The resulting signals are generally referred to as convolutionally encoded symbols.

2. Description of the Related Art

Communications channels in general and digital wireless communications in particular must counteract noise which may obliterate individual transmitted symbols. Conceptually, there are two approaches to this problem: one, by introducing redundancy and another, by smearing the transmitted information over multiple symbols. These approaches are not entirely separate since any redundancy makes it easier to spread the information over a plurality of signals, but neither are the two approaches identical.

Convolution codes are often used to implement the smearing of information over several symbols. Simply put, the EXCLUSIVE_OR (XOR) logic operation is applied to several recent information bits (equivalently, the information bits are summed modulo 2) to generate a bit that is to be transmitted. A second or third convolution code can be used to generate a second or third bit and thereby introduce redundancy as well as the information smearing in the transmitted symbols. These several bits are often combined and transmitted as a single symbol, represented perhaps by one state of a modulation constellation.

Referring to FIG. 1, an example of channel coding used for IS-95 is illustrated. The IS-95 encoder 10 has a series of delay line components 11. A first set of selected signals from the terminals of the delay line components 11 are applied to a first XOR component 12, while a second set of selected signals from the terminals of the delay line components are applied to a second XOR component 14. This rate ½ code has constraint length 9, i.e. 9 delay line components 11. Notice that for this encoder, each input bit results in two different output bits and that each of the two output bits depends on the current input bit and either four or five of the preceding eight input bits. Assuming that the preceding eight bits are fixed, there are only two output bit-pairs possible from XOR components 12, 14 depending upon the next input bit. However, there are four possible output bit-pairs that could be transmitted in all when the preceding bits are not fixed.

Note that, for the exemplary IS-95 channel encoder, a single input bit affects the next 9 output bit pairs, no one of which reflects exactly the information of that single input bit. The convolution codes smear the information of the single input bit over eighteen bits of output bit pairs. The virtue of this smearing of information is that, when a single symbol (or even more than one symbol) is corrupted in transmission, the decoder often can still recover the input information bit.

Computing Metrics

Pairs of output bits become symbols that have some physical representation on the communications channel. These symbols are transmitted and the receiver makes a measurement of the resulting signal that it receives. Of course, the received signal differs from the signal that is transmitted and the difference between the two signals is called noise. The receiver can calculate the distance between the received signal and each of the four symbols that might have been transmitted. The details of the computation of this metric depend on the particular communications channel and how the states are represented physically.

In the receiver's computation of metrics, a first option provides for the conversion of the received signal to a digital signal (in this case a pair of bits) and then computation of the metric. Apparatus using this approach is called a hard decision decoder. The other option, which is more complex computationally but which generally results in fewer errors, is the computation of the metric from the original signal levels; this process being provided by a soft decision decoder.

Trellis Decoding

Referring next to FIG. 2, a four-state trellis diagram, according to the prior art, is illustrated. Each column of the trellis diagram represents a Viterbi decoder at an instant of time and the arrows in the diagram represent the transitions of that decoder from one instant of time to the next. Notice that the nodes of the diagram are labeled with a pair of binary digits, 00, 01, 10, 11, the binary digits representing the state numbers 0, 1, 2, and 3. Also observe that the arrows between nodes are labeled either 0 or 1 and that the label of each node is always formed by concatenating the labels any pair of arrows from two columns earlier that lead to that node. Expressed another way, the number of each node specifies the last two (because this is a four-state decoder) transitions made to get to that state. Of course multiple paths lead to each state, but these paths differ only at earlier transitions.

Referring once again to FIG. 2, in moving from one increment of time to the next, the Viterbi decoder, i.e., a decoder that decodes convolutionally encoded symbols, receives or computes metrics representing the distance from the received signal to what would be transmitted for an information bit of "0" and for an information bit of "1". This computation is performed for each possible history of transmitted bits as encoded by the various state identification numbers. These metrics are referred to as transition metrics and they include the noise for a current symbol. The transition metrics are summed along the paths and these sums are called path metrics.

Two arrows represent transitions that can enter each node and two other arrows represent transitions that can leave each node. At each node, path metrics are associated with each incoming arrow. The trellis decoder selects the smaller path metric, i.e., the path metric representing the smaller noise figure of the two incoming signals. All of the paths associated with the non-selected arrow (i.e., transition) are permanently abandoned by the trellis decoder. The transition metric corresponding to an information bit of "1" is added to the surviving incoming path metric and the sum is forwarded to the node at the next time instant along the arrow labeled 1. Similarly, the transition metric corresponding to an information bit of 0 is added to the surviving incoming path metric and sent to the node at the next time instant along the arrow labeled 0. The configuration of two incoming arrows and the two outgoing arrows from a node can be described as a butterfly diagram.

Referring to FIG. 3, examples of butterfly diagrams are shown for a 16-state encoder. For each butterfly diagram, two states serve as input transitions to determine two states for the next time increment. For example, for the butterfly diagram represented by the solid lines, the states 0001 and 1001 serve as inputs to the determine the states 0100 and 0011 for the next time increment. Unfortunately, a significant amount of memory is needed to specify each state. In implementing the decoding algorithm, not only is the history information associated with each state retained, but the path metrics are also retained, i.e., for selecting between two input transitions that terminate on the same state. If the butterfly operations are processed as indicated in FIG. 3, two copies of these data groups would be required to be saved in order that the storage resulting from one butterfly diagram does not corrupt the input data needed to process the result of a different butterfly diagram.

An alternative to the doubling of the required memory is to re-assign the state table at each iteration as illustrated in FIG. 4. Note also in FIG. 4, at each stage, the butterfly operation is applied in a quite regular fashion, the pattern merely changes from one time increment to the next time increment. Specifically, the height of the butterfly transition is constant within each stage, but reduces by half from one stage to the next stage.

The primary, but not sole advantage to re-arranging the order of the state memories is that, as the data for a state is updated, the new data can be stored in the same locations that were used, although for a different state number, at the previous stage. In more visual terms, referring to FIG. 4, the inputs and outputs for each butterfly operation lie at the same positions of the arrays, i.e., the transitions are horizontal.

By selecting the transition with the smaller path metric in the decoder, at each step in time, the number of paths stays constant in the following sense. Half of the entering paths are abandoned, but the surviving paths are appended with both 0 and with 1, creating two paths for each of the surviving paths.

After a sufficient period of time, various paths are abandoned and the number of surviving paths that (at a fixed earlier time $t_0$) pass through a given state becomes ever smaller. Eventually, all of the surviving paths will pass through only a single state and at that time, the decoder can conclude that the most likely information bits are represented by that particular state at time $t_0$.

In implementing a Viterbi decoder, two practical difficulties are present: computational load and the demand for memory. The computational load is more a result of the high symbol rates than of the complexity of the calculation, but a strong incentive still exists to design the algorithms to be as efficient as possible.

The memory demands of a Viterbi decoder derive from the need to maintain an indefinitely long history of the paths surviving to each of the states. Maintaining long histories for each of the 256 states of an IS-95 decoder, for example, can require large amounts of memory. A common solution to the problem of maintaining long histories has been to force the decoder to make decisions prematurely and therefore guarantee a fixed history length. However, such truncations introduce errors and, in order to avoid excessive errors with this approach, history lengths of 4–5 times the constraint length are generally recommended.

Traditional Viterbi decoders, i.e., decoders of convolutionally encoded symbols, record (as a single bit in "trace-back" memory) each decision that is made. At a later time, the decoder must work backward through this historical record, one bit at a time, to determine the final decoded record. This trace-back operation can be computationally intensive.

Often, data is encoded in "frames" consisting of a fixed number of bits and with several zero's added to the end. This procedure allows the decoder to assume that the final state of the frame is zero. Having a known final state greatly simplifies the trace-back problem.

A need has been felt for an apparatus and a method having the feature that the implementation of the decoding of convolutionally encoded symbols is improved. Another feature of the apparatus and method would be that the implementation of the decoding of convolutionally encoded symbols requires less memory. Still another feature of the apparatus and method would permit path trace-back to be performed in units of more than one bit at a time (viz., {constraint_length_1 } bits at a time). Yet another feature of the apparatus and method would be the decoding of convolutionally encoded symbols in blocks of symbols.

SUMMARY OF THE INVENTION

The aforementioned and other features are accomplished, according to the present invention, by providing a unit, hereinafter called a block trellis decoder, that makes decoding decisions determined by the multiple paths entering and exiting from the nodes of a Viterbi trellis diagram. In the present invention, rather than maintain a full history for each node, linked lists of histories are maintained. A procedure for selecting paths based on path metrics is used. Because paths are abandoned at each step, the histories for more distant past events can be compressed to become ever-shorter tables. A set of paths can be summarized in a single file. Each file includes, for each state through which a surviving path passes: a state binary number, the state binary number indicating the set transition history; an index number pointing to a state binary number in the previous file; and a path metric quantity. Forcing the decoder to make premature decisions may still be necessary, but this will be because the total memory describing the transition history has been exhausted. Because this memory is used flexibly and efficiently, forcing premature decision will be necessary less often than when all history back to a fixed point in the past is maintained.

BRIEF DESCRIPTION OF THE DRAWINGS

The present invention may be better understood, and its numerous objects, features, and advantages made apparent to those skilled in the art by referencing the accompanying drawings.

FIG. 9A illustrates a format for files maintained for a plurality of symbols received by the decoder unit for a two state convolutional encoder, while FIG. 9B identifies the path that is illustrated by the files according to the present invention.

FIG. 10A illustrates a second format for files maintained for the same plurality of symbols illustrated in the FIG. 9A, while FIG. 10B identifies the path that is illustrated by the files according to the present invention.

The use of the same reference symbols in different drawings indicates similar or identical items.

DESCRIPTION OF THE PREFERRED EMBODIMENT(S)

Detailed Description of the Figures

FIG. 1, FIG. 2, FIG. 3 and FIG. 4 have been described in relationship to the prior art.

In the preceding description, the terms Viterbi and trellis were both used in a generally accepted manner. The device that decodes convolutionally encoded symbols is typically called a Viterbi decoder. However, a term is needed for a specific type of Viterbi decoder. This designation is needed for a unit that makes decisions illustrated by the multiple paths in and out of the nodes of FIG. 3. Hereinafter, this unit will be called the block trellis decoder and the operations of the block trellis decoder will be referred to as block trellis decoding operations. As will be clear to those familiar the application of the Viterbi algorithm, this terminology is specific to the discussion of the present invention.

The input to a Viterbi decoder inherently has a bit-at-a-time nature, but the consumer of its output is a processor that works more naturally and efficiently with data that is organized into bytes or even 16-bit words. As was discussed above, for a decoder with $2^B$ states, a state number itself specifies the most recent B transitions leading to that state. These two considerations lead to a decoder design, which (for a 256 state decoder) is byte-oriented in the sense that eight time-steps are taken, representing eight input symbols and then the decoder outputs a table which resolves as much of the history as it can.

Figure 1:
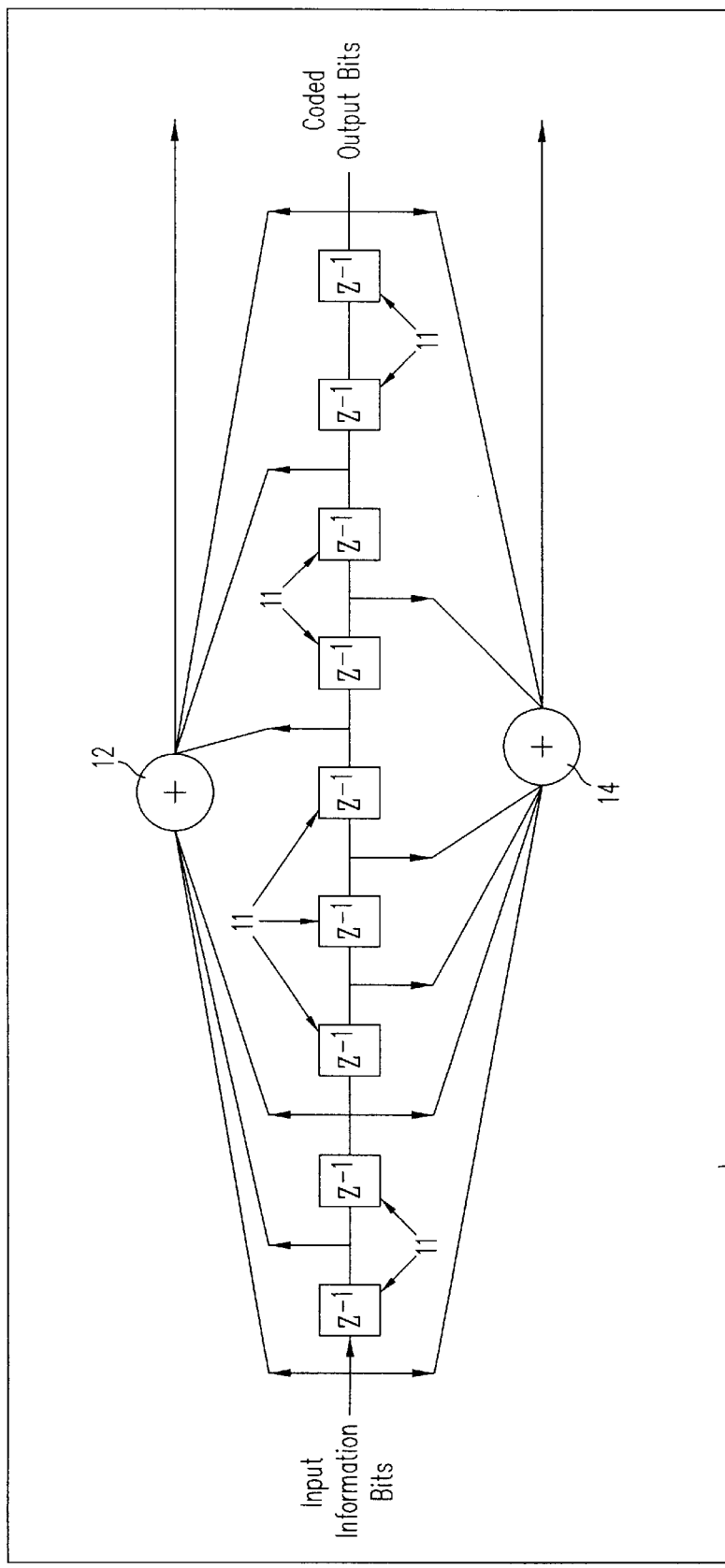
FIG. 1 is an example of channel or convolutional encoding according to the prior art.
Figure 2:
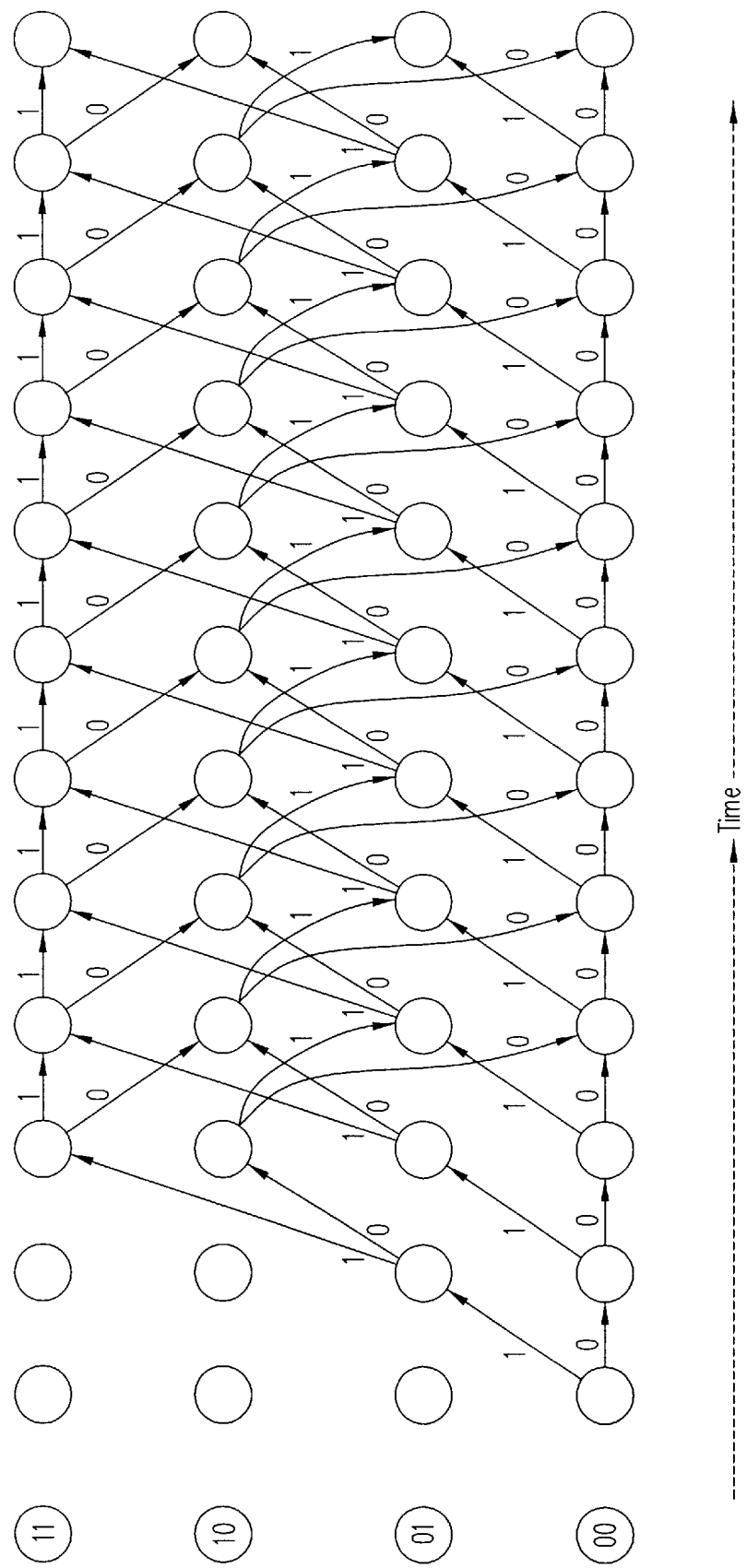
FIG. 2 illustrates a 4-state Viterbi trellis diagram according to the prior art.
Figure 3:
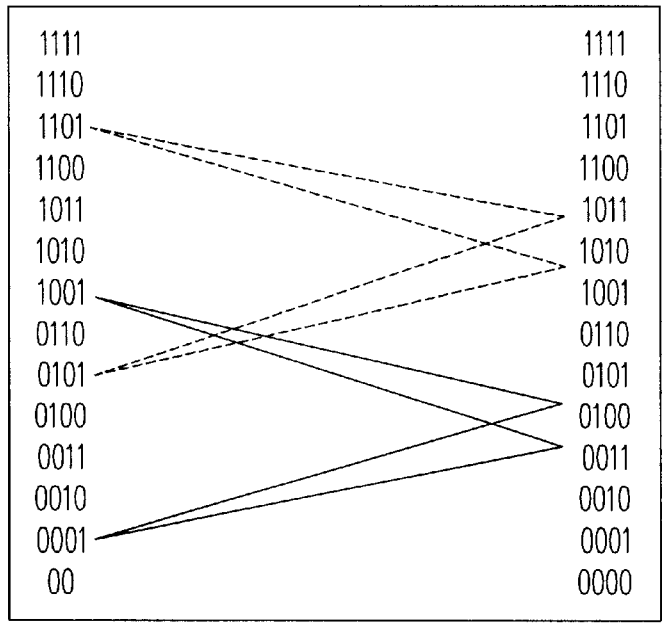
FIG. 3 illustrates examples of butterfly diagrams for a 16 state decoder unit according to the prior art.
Figure 4:
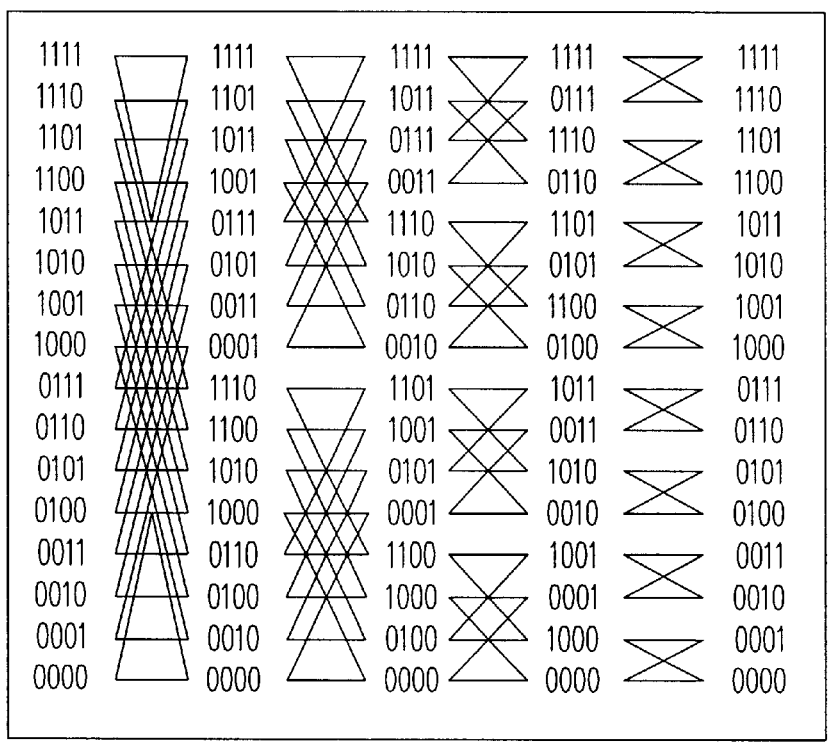
FIG. 4 illustrates the cyclic nature of the butterfly diagrams for a 16 state decoder unit wherein the state designation is altered from the processing of one symbol to the next symbol according to the prior art.
Figure 5:
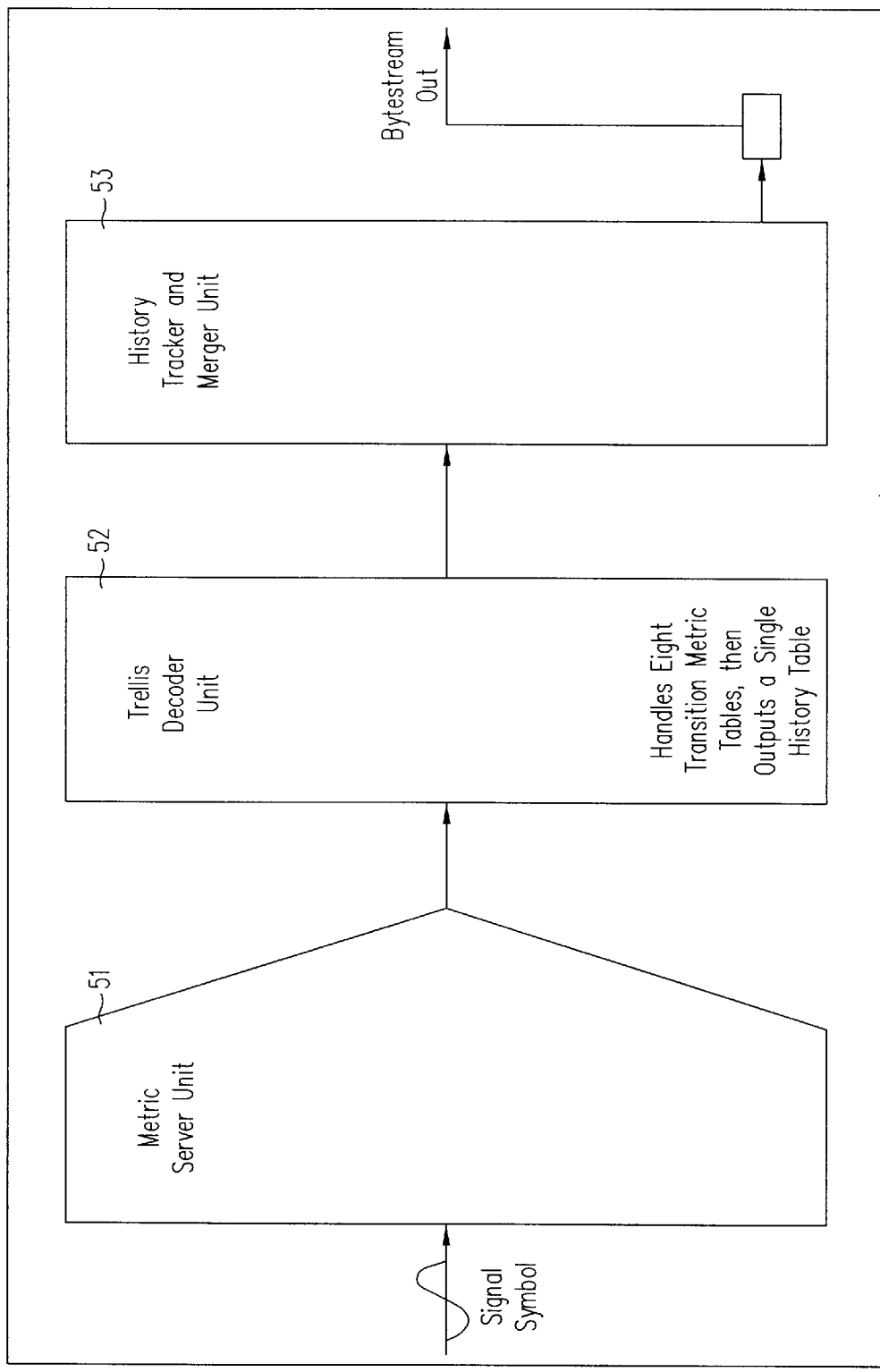
FIG. 5 illustrates s a block diagram of a Viterbi decoder according to the present invention.

Referring to FIG. 5, a block diagram, illustrating the overall operation of the inventive block trellis decoder 50 is shown. The term "block trellis decoder" is derived from a characteristic of the decoder, the characteristic being that the block trellis decoder processes a block of B symbols and then provides an output table before continuing the processing of the next block of B symbols. The block trellis decoder 50 includes a metric server unit 51, a trellis decoder unit 52, and a history tracker and merger unit 53. The metric server unit 51 receives the communication signals or symbols from the channel and develops the transition metrics in the form of tables, a transition metric being assigned to each state. The transition metric tables are transferred to the trellis decoder 52. The trellis decoder 52 maintains internally a history of the most recent transitions (from 0 to 8, depending on time). For IS-95, for example, the output of the trellis decoder 52 is a table of up to 256 words. Each word is a 16-bit structure that includes two eight-bit fields; one eight-bit field (the index) represents the path transition metrics that occurred just before those transitions that are recorded within the trellis decoder. The remaining eight-bit field holds a pointer into the next earlier table, a table that was recently passed along to the history tracker and merger unit 53. As noted before, the history tracker and merger unit 53 maintains these tables, subject to memory being available, for as long as necessary until a table is reduced to a single entry. At that time, the remaining entry and any entries that it points to in succeeding tables represents a decision that can be reported out from the history tracker and merger unit 53.

In FIG. 5, all three units may be implemented in software, just, as it is possible that all three units may be implemented in hardware; however, for many if not most applications, units 51 and 53 are anticipated as being implemented as software being processed by a digital signal processor (DSP) or other data processing unit while the trellis decoder unit 52 will be implemented in hardware.

Referring once again to FIG. 5, the operation of one embodiment of the metric server 51 in computing the transition metrics for IS-95 can be illustrated, using two stage encoding in the following manner. The metric server 51 receives channel information in the form of signals R, wherein $$R=P(S_x+d)=P \cdot S$$

where P is a power factor, which for the duration of a frame can be treated as a constant, $s_x$ is the transmitted signal, and d is the channel distortion. Consecutive pairs of these signals encode a single bit.

The metric server 51 can compute transition metrics by summing pairs of terms $\pm R_i$ with the selection of + of − taken according to which symbols are generated by candidate state transitions for the encoder. The justification for taking simple sums rather than computing the squared Euclidean metric (by summing the terms of the form $(R_i \pm |P|)^2$) is that these two approaches yield path metrics that differ by only a constant of the form $$\Delta = \Sigma(R_i^2 \pm |P|^2)$$

For decoding a single frame at a particular rate, using only the middle term (with the constant, $2|P|$, canceled out) is equivalent to the more complex computation of the Euclidean metric. The quantities $\pm R_i \pm R_{i+1}$ are not only computationally simpler, but avoids the issue of estimating a value for $|P|$.

The four choices of signs in the expression $\pm R_i \pm R_{i+1}$ provide the transition metrics, $m_0$, $m_1$, $m_2$, and $m_3$ that are required. However, these numbers are signed. A way to avoid the use of signed metrics is to use instead the metrics defined by TR00=$m_0-m_{min}$, TR01=$m_1-m_{min}$, TR10=$m_2-m_{min}$, and TR11=$m_3-m_{min}$ (where $m_{min}$ in the minimum of $m_0$, $m_1$, $m_2$, and $m_3$). This operation is permissible because the difference is only a constant, $m_{min}$. In addition, one of the four metrics is always zero.

An equivalent (but computationally simpler) means for computing the same signed transition metrics is summarized as follows. Given an pair of input signals, $R_a$ and $R_b$, let $A_0=R_a$ if $R_a>0$, otherwise $A_0=0$
$A_1=0$ if $R_a>0$, otherwise $A_1=-R_a$
$B_0=R_b$ if $R_b>0$, otherwise $B_0=0$
$B_1=0$ if $R_b>0$, otherwise $B_1=-R_b$ It follows that $TR00=A_0+B_0$
$TR01=A_0+B_1$
$TR10=A_1+B_0$
$TR11=A_1+B_1$ As will be clear, the transition metrics can be calculated in a manner different from the examples described above for the IS-95 example. For the present invention, it is useful that the values be unsigned and critical that the larger metric correspond to a less likely transition.

After generating the transition metrics in the metric server 51, a table of metric values is transferred to the trellis decoder 52. For decoding a rate ½ convolution code, this table will have four entries. More generally, a rate 1/n code will require this table to have $n^2$ entries. In the trellis decoder, three tables of length $N=2^B$ are maintained. One table, the history table keeps track of the transitions made while decoding the current block. Together with the history table, a second table, the index table, serves in constructing the table to be output at the end of the processing the current block. The index table holds the pointer into tables that were output at the end of earlier blocks (or 0 if there were no earlier tables). Both the history and index tables are words of data that are B bits wide. Finally, a table of path-metrics is used to keep track of the sum of transition metrics for the surviving paths. The width of the path-metrics is determined as a compromise between performance (bit-error rate) and cost (substrate size and circuit power). The activity of the trellis decoder unit can be understood as follows.

Figure 6A:
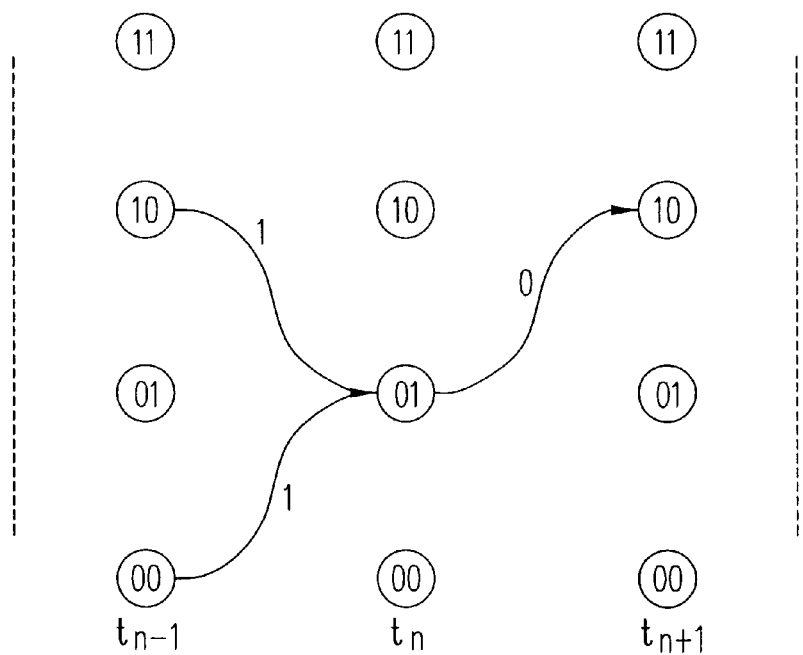
FIGS. 6A–6B illustrate the multiplicity of paths that are described by the state identification numbers for a four state Viterbi decoder according to the present invention.
Figure 6B:
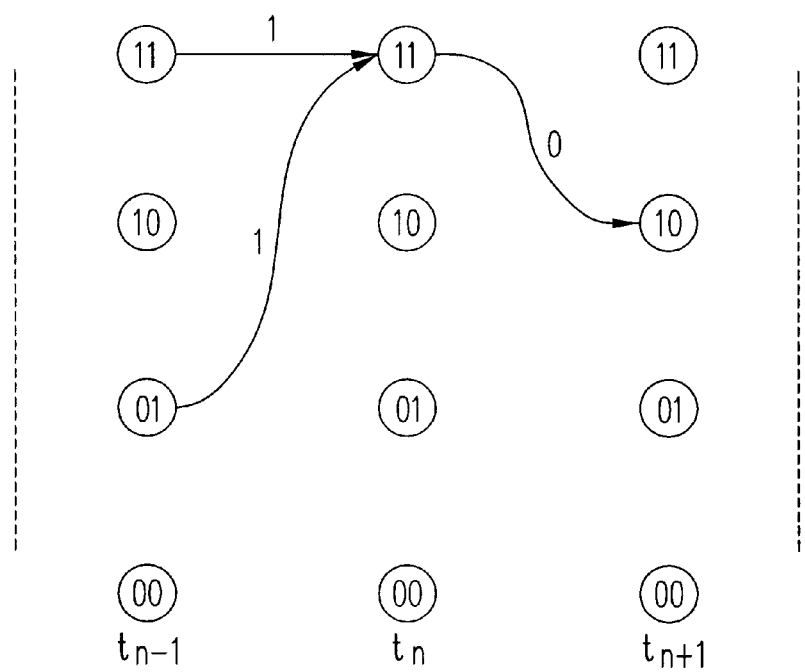

Before proceeding, it should be recalled that the state number is determined by the sequence of recent transitions that comprise the binary identification of the state number. For example, referring to FIG. 6, for the four state encoder, the (10) state is reached by 0-transition preceded by a 1-transition. However, as can be seen from FIG. 6A, two paths have the 1-transition followed by a 0-transition. Referring to FIG. 6B, two more paths are possible that provide a 1-transition followed by a 0-transition. However, as will be clear by review of FIG. 6A and FIG. 6B, each of these paths has a different starting state. Therefore, focusing on a path within a block, the starting state number and the final state number determine the path for the block of symbols being processed by the trellis decoder 52. Summarizing, because the identification of a state is determined by the preceding transitions, within a block a path involving a plurality of states is uniquely determined by the initial state and the final state when the number of intervening transitions is equal to the binary characters identifying the state.

Let the states of a path through the $2^B$ state trellis be, where the block size is B (=constraint_length-1), $$0=S_0, S_1, \ldots, S_B, S_{+1}, \ldots$$

As noted above, the fact that "the path assumes states $S_{nB}$ at time nB" determines the transitions during the preceding block of B symbols. It follows that the sequence of states $S_B$, $S_{2B}$, $S_{3B}$, ... is sufficient information to construct all of the transitions (equivalently, the entire path). The strategy used for the block trellis decoder is to develop, at the end block n+2, an output able which, in general, makes it easy to compute for a surviving path, $S_{nB}$ from $S_{(n+1)B}$. Notice that makes it easy, at any time, to compute the entire surviving path that ends at a particular state, $S_{nB}$.

Figure 7:
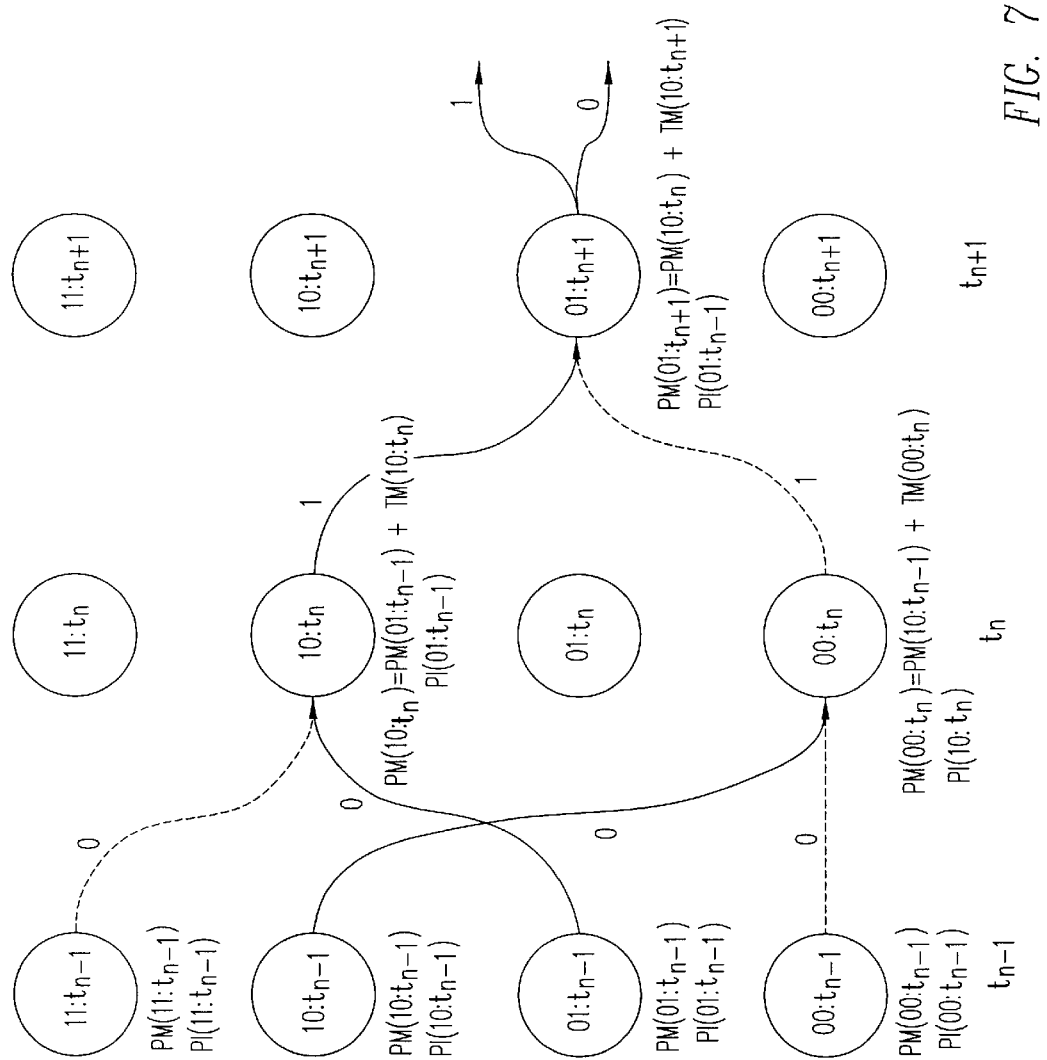
FIG. 7 illustrates the processing of a symbol in a four-state decoder according to the present invention.

The operation of the decoder in processing a single symbol is illustrated using a four-state decoder as an example. Referring to FIG. 7, at time $t_n$, a certain set of paths have survived; in fact, one path has survived for each of the four states and so each state will have a path metric as well as a (two-bit) history and a (two-bit) index associated with the state. Associated with the symbol detected at time tn, is a table of transition metrics, however, the particular metric value associated with a '1' transition will depend on which state $(xy:t_n)$ is under consideration. Associated with state $(xy:t_n)$ is a path metric $PM(xy:t_n)$ as well as two transition metrics, $TM^0(xy:t_n)$ and $TM^1(xy:t_n)$. The first of these transition metrics is associated with a transition to the state $(y0:T_{n+1})$ and the second with a transition to the state $(y1:T_{n+1})$. Also associated with state $(xy:t_n)$ is an index value, $I(xy:t_n)$, and a history value, $H(xy:t_n)$. From consideration of FIG. 7, two $(xy:t_n)$ states can have a 1-transition to the $(01:t_{n+1})$ state, $(00:t_n)$ state and the $(10:t_n)$ state as shown in FIG. 7. The trellis decoder unit can select either the path surviving to the $(00:t_n)$ state or the path surviving to the $(10:t_n)$ state. The trellis decoder makes this selection by determining which of $\{PM(00:t_n)+TM^1(00:t_n)$ or $(PM(10:t_n)+TM^1(10:t_n)\}$ is smaller. In FIG. 7, the second of these quantities, $\{PM(10: t_n)+TM^1(10:t_n)\}$, is the smaller so the path surviving to the $(10:t_n)$ state is extended to be the one to survive to the $(10:t_n)$ state. This path is illustrated in FIG. 7 by the fact that the path through the $(10:t_n)$ state and the $(01:t_{n+1})$ state is drawn with a solid line whereas that path through the $(00:t_n)$ state is drawn with a dotted line to show that it does not survive to time $t_{n+1}$. For the surviving path through state $(01:t_{n+1})$, the path metric is updated as $$PM(01:t_{n+1})=(PM(10:t_n)+TM^1(10:t_n))$$

At the same time, $H(01:t_{n+1})$ is recorded as $H(10:t_n)$.

Trellis decoder unit 52 can be implemented in two distinct embodiments. In one embodiment (suitable for a software implementation of the trellis decoder unit), $I(01:t_{n+1})$ is recorded as $I(10:t_n)$. In a second embodiment (suitable for a hardware implementation), the index values are not modified when processing symbols. The reason for the two different realizations is that the second embodiment involves less data movement and so will consume less power in a hardware implementation. In a software implementation, the history and index values can often be held in a single machine word and, in this case, both assignments are done in a single operation. The benefit of this process is that the computation of the table to be passed to the history tracker and merger unit 53 is slightly simpler.

In either embodiment, the paths through the other states are handled analogously. Likewise, in a decoder with more states (e.g., the IS-95 decoder with 256 states), the operation is exactly the same for each state. As will be clear to those skilled in the art of Viterbi decoders, it is possible to conserve memory in the trellis decoder unit and simplify computations by operating on pairs of states together so as to update the path metrics, history and (in the case of the first embodiment) index values for the two states at the same time, keeping the same memory locations. This implies that the data associated with a given state moves from one location to another from one time interval to another; however, at the end of (constraint_length_1) steps all of the data are back to their original locations. This observation considerably simplifies the production of the tables that are output to the history tracker unit.

Figure 8:
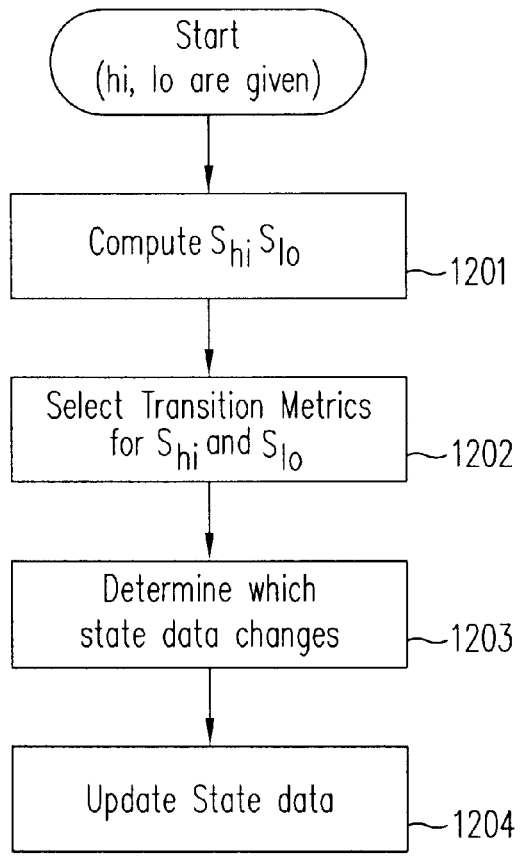
FIG. 8 illustrates how the files transferred to the history tracker and merger unit by the trellis decoder for a four state decoder for convolutionally encoded symbols are generated according to the present invention.

Each time a table of metrics arrives, the trellis decode unit must update the state information (i.e., the path metric, history and, in the first realization, the index) for each state. These operations are most conveniently performed on pairs of states in what is called a butterfly operation. For example in a 256 state decoder, 128 butterfly operations are performed each time a table of metrics arrives (i.e., for each symbol). The state information resides at the two indices lo and hi in the tables of state information inside the trellis decode unit 52. Keep in mind that the states at these indices change from one time to the next so that the indices of the updated states will also be lo and hi. The states re-arrange themselves back to the original order after four rearrangements for the sixteen state decoder. In the case of the four state decoder, the original order is achieved after two successive re-assignments; in the case of the 256 state decoder, i.e., the IS-95 decoder, the original order is achieved after eight successive re-assignments. In addition, with these reassignments at each stage, much of the data movement required by the butterfly operation is avoided because the butterfly operation calls for history bytes to be simply copied to their previous location. Referring to FIG. 8, the butterfly operation is illustrated. The first step (1201) of the butterfly operation is to determine the states, $S_{hi}$ and $S_{lo}$, corresponding to the indices hi and lo. This determination is necessary in order to then establish the four transition metrics out of those two states which we will call TR(lo,lo), TR(lo,hi), TR(hi,lo) and TR(hi,hi) (for example, TR(lo,hi) is the transition metric associated with a transition from lo to hi) in step 1202. The path and transition metrics are needed to determine which paths will be extended (and how they will be extended). This identification of the surviving paths allows us to determine which history (and in the first embodiment, index) values will be updated in step 1203. There are four possibilities and these can be encoded as a number from 0 to 3. Specifically, (0) neither are updated; (1) lo is updated; (2) hi is updated; and (3) hi and lo are updated. The details of the updates are as follows:

| (0) | PM(lo) | ←PM(lo) + TR(lo,lo) |
|---|---|---|
|  | PM(hi) | ←PM(hi) + TR(hi,hi) |
| (1) | PM(lo) | ←PM(hi) + TR(hi,lo) |
|  | PM(hi) | ←PM(hi) + TR(hi,hi) |
|  | H(lo) | ←H(hi) and in embodiment 1, I(lo) ←I(hi) |
| (2) | PM(lo) | ←PM(lo) + TR(lo,lo) |
|  | PM(hi) | ←PM(lo) + TR(lo,hi) |
|  | H(hi) | ←H(lo) and in embodiment 1, H(hi) ←H(lo) |
| (3) | PM(lo) | ←PM(hi) + TR(hi,lo) |
|  | PM(hi) | ←PM(lo) + TR(lo,hi) |
|  | H(lo) | ←H(hi) and in embodiment 1, I(lo) ←I(hi) |
|  | H(hi) | ←H(lo) and in embodiment 1, H(hi) ←H(lo) |

The trellis decoder unit 52 maintains only a single copy of the path metric, index and history for each state, though these values change with time. Using the four state decoder as an example, after updating the path metrics, indexes and history data at time $t_{2n+4}$, the trellis decoder passes a table of data to the history tracker and merger unit 53 which will enable the unit to compute, for the paths that survive at time $t_{2n+4}$, the state $S_{2n}$ from the state $S_{2n+2}$. To describe the computation of this output data it is useful to simplify our notation. At time $t_{2n+4}$, the only information remaining in the trellis decoder relates to time $t_{2n+4}$, so for simplicity we will not include the time. Also, the state information will be indicated as simply an index and not as a binary number. At time $t_{2n+4}$, the trellis decoder unit 52 incorporates three tables, $PM_k$, $I_k$ and $H_k$ where k takes values 0, . . . , 3. Only $PM_k$, $I_k$ and $H_k$ are used or modified in producing the output table, but for convenience let us denote by $\square_k$ the surviving path through state $S(k:t_{2n+4})$.

Recall that the path metrics are unsigned and that arithmetic relating to the path metrics is in all cases saturated. One consequence of this is that there is a maximum value for the path metric, MAX, which is characterized by having all bits equal to 1. A path with a metric of MAX is regarded as no longer surviving.

Consider the first realization in which the index values have been updated. For k=0, 1, 2, 3, $H_k$ is the state that the path $\pi_k$ assumed at time $t_{2n+2}$. It is possible that $H_0$, $H_1$, $H_2$ and $H_3$ are all distinct, but in fact this will rarely be the case. More often there will be duplication, and an important aspect of producing the table to be transferred from the trellis decoder unit 52 is to remove these repetitions. For the purpose of illustration, suppose that $H_0$, $H_1$ and $H_2$ are distinct values, that $PM_1=MAX$ and that $H_2=H_3$. In this example, it necessarily follows that $I_2=I_3$, and that the trellis decoder unit will pass a table to the history tracker unit that has but two entries. In fact, it can pass the table:

| $H_0$ | $I_0$ |
|---|---|
| $H_2$ | $I_2$ | and in this case, the index table will be revised to the values $I_0=0$ and $I_2=I_3=1$ (to serve as an index into the table). Likewise, it could just as well pass the table:

| $H_2$ | $I_2$ |
|---|---|
| $H_0$ | $I_0$ | and revise the index table to the values $I_0=0$ and $I_2=I_3=0$. In either case, the history table is updated to the values $H_0=0$, $H_1=1$, $H_2=2$ and $H_3=3$ before the next symbol is processed.

In the second embodiment in which the index values have not been updated, we again observe that for k=0, 1, 2, 3, $H_k$ is the state that the path $\pi_k$ assumed at time $t_{2n+2}$. It is possible that $H_0$, $H_1$, $H_2$ and $H_3$ are all distinct, but in fact this will rarely be the case. More often there will be duplication, and an important aspect of producing the table to be output from the trellis decoder unit is to remove these repetitions. For the purpose of illustration, suppose that $H_0$, $H_1$ and $H_2$ are distinct values, that $PM_1=MAX$ and that $H_2=H_3$. In this example, it necessarily follows that $I_2=I_3$, and that the trellis decoder unit will pass a table to the history tracker unit that has but two entries. In fact, it can pass the table:

| $H_0$ | $I_{H_0}$ |
|---|---|
| $H_2$ | $I_{H_2}$ | and in this case, the index table will be revised to the values $I_0=0$ and $I_2=I_3=1$ (to serve as an index into the table). Likewise, it could just as well pass the table:

| $H_2$ | $I_{H_2}$ |
|---|---|
| $H_0$ | $I_{H_0}$ | and revise the index table to the values $I_0=0$ and $I_2=I_3=0$. Whichever of these two tables is transferred to the history tracker and merger unit 53, the history table is updated to the values $H_0=0$, $H_1=1$, $H_2=2$ and $H_3=3$ before the next symbol is processed.

More generally, for a decoder with $N=2^B$ states, the tables will be output at times $t_{(Bn+2B)}$ and those tables will have up to N pairs of B-bit numbers. Specifically, the IS-95 decoder will output tables of up to 256 pairs of 8-bit numbers at times $t_{(8n+16)}$. Notice that for this decoder the first table is output only after sixteen symbols have been processed. Notice also that the right-hand side of each entry of the first table is 0.

In the history merger and tracker unit, the object is to determine the most probable path through the multiplicity of states and transitions. The path determines a sequence of states. When each state is determined, the logic signals that generate that state are generally the logic signals that were originally transmitted. When the transmitted logic signals are determined, the sequence of logic signals that was applied to the convolutional encoder can be determined.

The operation of the two pointer-indexes is illustrated in FIG. 9A, FIG. 9B, FIG. 10A and FIG. 10B. In this procedure, the history files transferred from the trellis decoder remain the same, as seen by FIG. 9A and FIG. 10A. However, the index files in FIG. 9A and 10A are different. As shown in FIG. 9A, an index entry points to a history entry in the previous file set. However, as shown in FIG. 10A, in brackets, an index entry points to an address (in brackets) in the previous history file. The index files in the first chronological file are the same as in FIG. 9A and 10A and are the starting state for the sequence of files. As illustrated in FIG. 9B and 10B, the same binary number sequence is provided as a result of following (backtracking) the path through the transferred files.

Figure 11A:
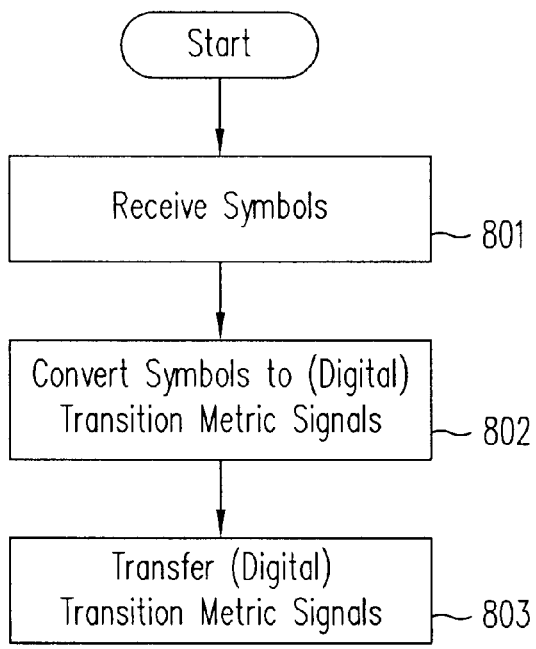
FIG. 11A is a flow diagram illustrating the operation of the metric server.
Figure 11B:
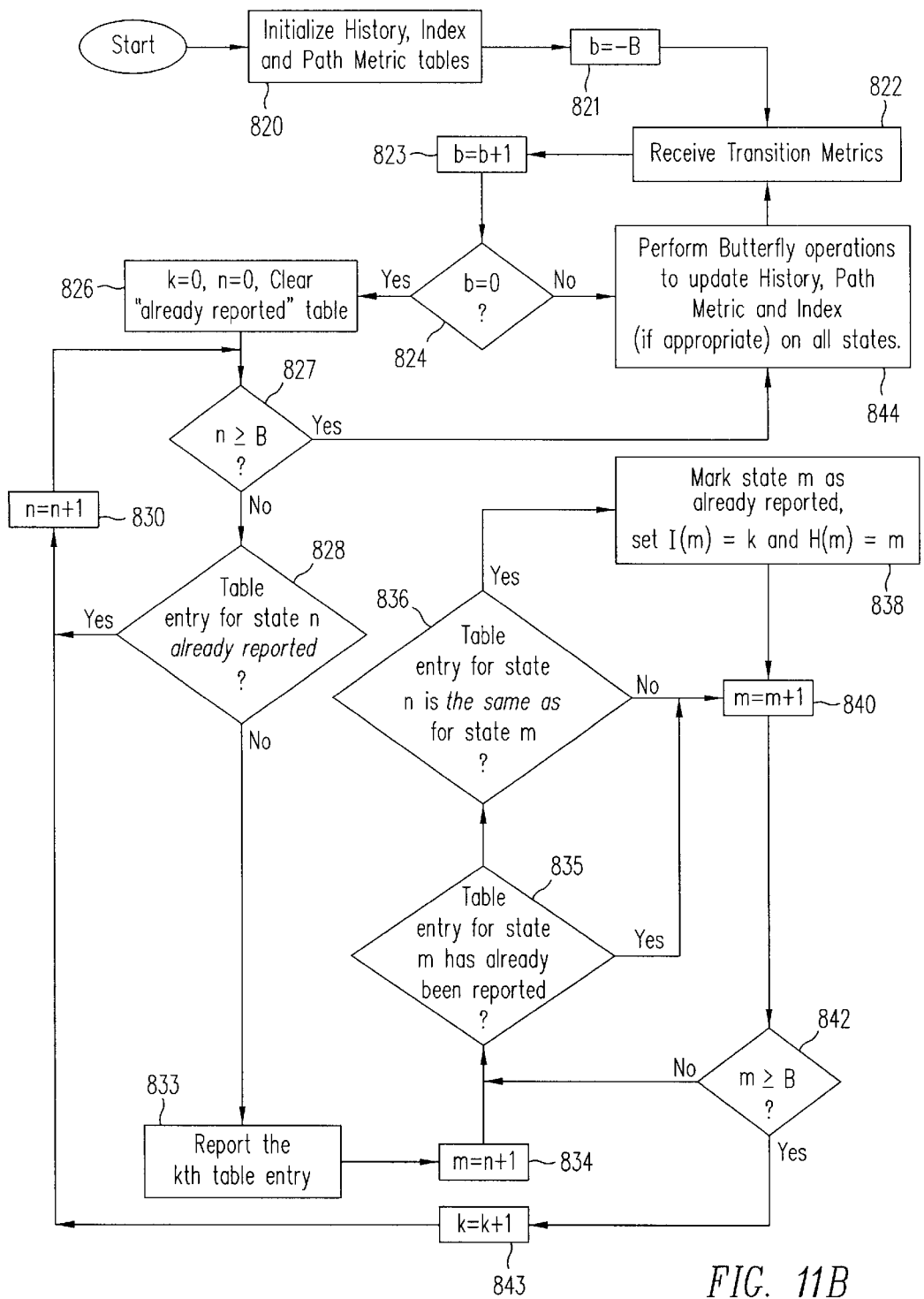
FIG. 11B is a flow diagram of the operation of the trellis decoder unit.
Figure 11C:
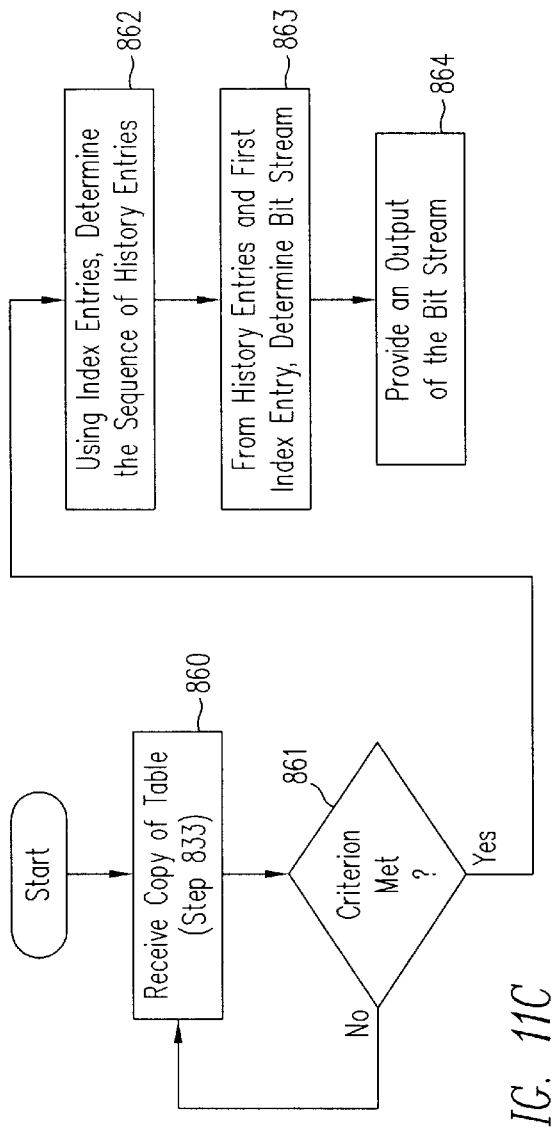
FIG. 11C is a flow diagram illustrating the operation of the metric tracker and server unit, according to the present invention.

FIG. 11A, FIG. 11B, and FIG. 11C provide flow charts illustrating the operation of portions of the invention. Referring now to FIG. 11A, the operation of the metric server is illustrated. In step 801, the metric server unit receives the transmitted encoded signals, generally referred to as symbols from the channel. In step 802, the symbols are converted to digital quantities referred to as transition metric signals. The transition metric signals are then transferred, in step 803, from the metric server unit 51 to the trellis decoder unit 52. The transition metrics are associated with a state. As will be clear to those familiar with "soft decision" Viterbi decoders, a conditional decision is made for each possible value of the most recent B bits (i.e., each possible state). In the trellis decoder then, in considering each state k, the most recent encoded bits are assumed to be described by the state number k. With this understanding, the two expected symbols are known to correspond to an uncoded logic "0" bit or/and uncoded logic "1" bit. The transition metrics at state k are, therefore, the differences between the actual received symbol (with its noise) and each of the two symbols (no noise) that the encoder would have provided as output under these alternatives. These two selections, as a function of state, can be computed once given the convolutional codes of the encoder.

Referring now to FIG. 11B, the operation of one implementation of the trellis decoder is illustrated. In step 820, the history table, the index table and the path metric table are initialized. The symbol variable b is set equal to −B in step 821. In step 822, the transition metrics are transferred from the metric server to the block trellis decoder. In step 823, the variable b is incremented to the value b+1. In step 824, a determination is made whether the variable b=0. If b=0 in step 824, the table entry variable k is set to k=0, state variable n is set to n=0, and the "already reported" table is cleared in step 826. A determination is made whether n≧B in step 827. When, in step 827, n is not ≧B, a determination is made whether the table entry for state n has already been reported in step 828. When the determination in step 828 is made that the entry table for state n has already been reported, then the procedure continues to step 830 wherein the variable n is incremented to n+1. From step 830, the procedure returns to step 827. When, in step 828, a determination is made that the table entry for state n has not already been reported, then in step 833 the kth table entry is reported. In step 834, the variable m is set equal to n+1. In step 835, a determination is made whether the table entry for the mth state has been reported. When in step 835, a determination is made that the table entry for state m has already been reported, then m is set equal to m+1 in step 840. When a determination is made in step 835 that the table entry for state m has not already been reported, then a determination is made whether the table entry for state n is the same and the table entry for state m in step 836. When in step 836 the table entry for state n is not the same as the table entry for state m, then the decision proceeds to step 840. When the decision is made in step 836 that the table entry for state n is the same as the table entry for state m, then the state m is marked as already reported, I(m) is set=k and H(m) is set=m in step 838. The procedure then returns to 840 where m is set equal to m+1. In the step 842, a determination is made whether m≧B. When m is not ≧B in step 842, then the procedure goes to step 835. When m≧B, then the variable k is set equal to k+1 in step 843. From step 843, the procedure goes to step 830. When n≧B in step 827 or when b≠0 in step 824, then in step 844, butterfly operations are performed to update the history entries, the path metric entries and index entries (if appropriate) for all states. Then the procedure returns to step 822 wherein the transition metrics are transferred from the metric server unit to the trellis decoder unit.

Referring now to FIG. 11C, the activity of the history tracker and merger unit depends on the transfer of the tables created in the trellis decoder unit, and has a counter part to step 833 of FIG. 11B in step 860 of FIG. 11C. In step 861, a determination is made whether a preselected criterion is met by the transfer of the table to the history and tracking unit. For example, one possible criterion is the transfer of a single history table in step 860. Another possible criterion which has been mentioned previously is the reduction of available memory space to an unacceptable level. A third possible criterion is that a history table of sufficiently small size is received (e.g., with only one entry) from the block trellis unit. When the criterion is not met in step 861, the process returns to step 860 to await the next transfer of a table. When the criterion is met in step 861, in step 862, the sequence of history entries forming a path from the last history entry is determined through the use of the index entries to provide a pointer to a history entry in the next earlier table transferred to the history merger and tracking unit in step 863. In step 864, from the sequence of history entries, a decoded bit sequence can be determined and this bit stream sequence can be provided as an input, after decoding and restoration of the signals, to an output device.

Figure 12:
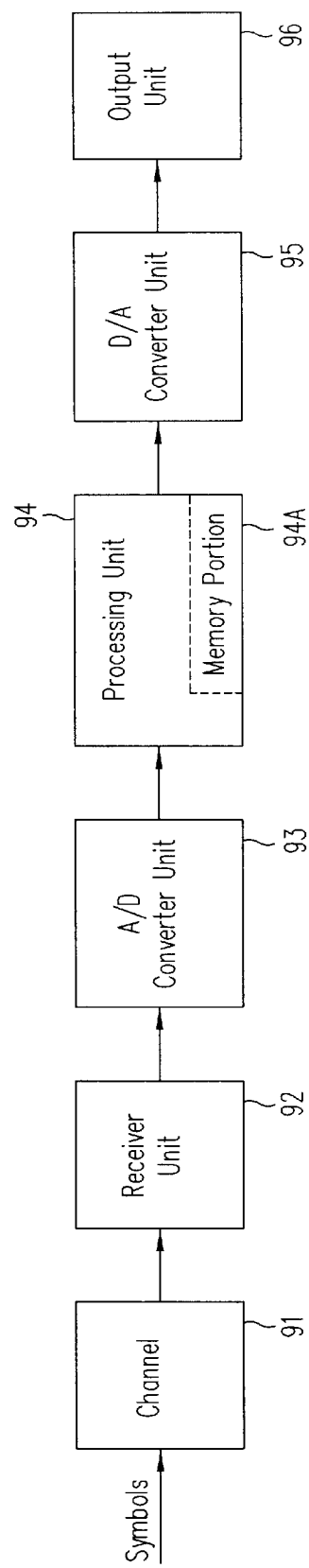
FIG. 12 illustrates one communication system incorporating the present invention.

Referring to FIG. 12, an implementation of the present invention is illustrated. The encoded symbols are transmitted through channel 91, the channel possibly introducing noise to the symbols, and applied to a receiver unit 92. The receiver unit 92 can, for example in the case wireless transmission, include an antenna and an amplifier. The signals from the receiver unit 92 are applied to analog/digital (A/D) converter unit 93, the A/D converter unit providing output signals in the form of digital magnitudes. The output signals from the A/D converter unit 93 are applied to processing unit 94. The processing unit 94 can be implemented by a hardwired processing unit, a processing unit processing signals entirely under the control of the software program, i.e., stored in a memory portion 94A, or a combination of hardware and software implementations. As a result of the processing in the processing unit 94, a decoded signal bit stream of signals can be provided (for example in the example of encoded voice information to digital-to-analog (D/A) converter unit 96. A/D converter unit 94 can apply signals to an output unit 96, e.g., loudspeaker.

Operation of the Preferred Embodiment

The decoding of convolutionally-encoded symbols is provided, according to the present invention, in three stages. In the first stage, the transition metrics are generated in response to the receipt of the transmitted symbols. The internal state of the block trellis decoder unit is maintained in several tables. The table entries include a history field, a field that is determined by the possible paths of the group of symbols, an index field, a field that identifies a history field in the preceding table, and a path metric field, a field that establishes the deviation of the path from the path most likely to have been followed by the encoded symbols. In the important IS-95 protocol, the table entries of the tables can be expressed in fields having 8 bits, a field length particularly convenient for manipulation by modern data processing systems. A single surviving path is identified by some criterion, e.g., only one path survives, the remaining possible paths having been discarded. By retracing the table entries of the surviving path, the transmitted symbols can be determined and, based on the determination of the transmitted symbols, the original signals can be determined. The procedure is summarized in FIGS. 11A–11C.

As will be clear from FIG. 12, the division of the present invention into a metric server unit, a trellis decoder unit, and a history tracker and merger unit, while useful for describing the operation of the present invention, is, in some implementations, artificial. For example, in the purely software implementation, this division would find expression in the modules of the software program. However, no specific part of the processing unit could be identified with a particular unit.

The present invention is particularly well suited to the IS-95 conventions. In this convention, the states are determined by an eight-bit binary number. Because the processing device is typically implemented in a byte, or multiple byte format, the use of eight-bit quantities is particularly advantageous.

As will be clear to those skilled in the art, the partition between the portion of the invention implemented in hardware and the portion of the invention implemented in software is flexible. The entire invention can be implemented in software and in some applications, such as the software modem, such an implementation is necessary. However, to accelerate the computation for higher data rates, hardware can be used to implement the entire decoder. For the IS-95 application, experience suggests that the most advantageous partition used DSP software to compute the vector of the four metrics and to perform the later trace-back operation, but implemented the rest of the decoding in hardware.

It will be further clear that the processing of transition metrics in blocks of symbols having B (=constraint length–1) members to provide tables having partial path information is particularly convenient, however, the division of the symbols in groups of B symbols is not essential. Blocks of symbols having a different number of members can be similarly processed. For instance, the number of members can be an integer times B. Such a division on symbols can be useful when B is small, wherein tables can be generated that more fully populate word-length data fields.

In the modified decoder, the variable length tables are transferred every n*B symbols, where B is (constraint length–1). The first table is transferred after (n+1)*B symbols rather than after 2B symbols. Internal to the block decoder unit, the butterfly operations operate as before, but at the end of each block of B symbols the history entries are left-shifted by B bits and the low order B bits of the k-th history entry are set to k. In this way, at the end of n*B symbols the history entries have n*B significant bits. This embodiment is useful for small constraint lengths, e.g., 5. In this case using the multiple of 3 would result in B=12 so that the variable length tables would again be 16-bits wide (12 bits of the history field+4 bits of index field. For constraint length 3, a multiple of 7 would similarly result in B=14, and with index entries of two bits, would result in 16 bit fields.

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

What is claimed is:

1. A method of block-decoding a convolutionally-encoded sequence of symbols, the method comprising:

for each symbol received, generating a plurality of transition metrics, wherein each transition metric is associated with a state;

for each state, selecting one transition metric for each of the plurality of possible transitions from the state;

performing a series of butterfly operations to update tables of state information for said each state;

for each group of a preselected number of symbols, generating a fixed length table that is updated by a plurality of butterfly operations, wherein each entry of the fixed length table includes a history entry, an index entry and a path metric entry for each state;

for said each group of a preselected number of symbols, generating a summary table, the summary table having a variable length; and upon identification of a predetermined condition, concatenating indexed history entries from the summary tables;

each index entry identifying a history entry in the summary table, the history entry being generated for the next previous group of symbols, wherein concatenating indexed history entries from the summary tables includes using the index entries to backtrack a sequence of history entries and at least a portion of the summary tables are transferred to system memory prior to backtracking.

2. The method as recited in claim 1 wherein the preselected number of symbols is equal to a number of logic bits identifying each state.

3. The method as recited in claim 1, wherein each history entry also identifies a symbol state.

4. The method as recited in claim 1 wherein the convolutionally-encoded symbols are encoded by an encoder having a constraint length of B+1, where B is a number of symbols in a group, and $2^B$ states.

5. The method as recited in claim 4 wherein the convolutionally-encoded symbols have been encoded by an encoder using an IS-95 protocol, and B is equal to 8.

6. The method as recited in claim 1 wherein the convolutionally-encoded symbols are encoded by an encoder having a constraint length of B+1, where n·B is a number of symbols in a group where n is an integer, and $2^B$ states.

7. The method as recited in claim 1 wherein each index entry identifies a history entry in a next previous summary table or comprises a location of a history entry in a next previous summary table.

8. The method as recited in claim 1 wherein the backtracking is initiated when the variable length of the summary table is one.

9. The method as recited in claim 1 wherein each of the convolutionally-encoded sequence of symbols are encoded in an IS-95 format, including a constraint being 9 and a number of states being 256.

* * * * *